United States Patent [19]

Hein

[11] Patent Number: 4,805,771

[45] Date of Patent: Feb. 21, 1989

[54] BELT FOR MACHINE DELIVERY OF PIECE GOODS, ESPECIALLY ELECTRICAL COMPONENTS AND MODULES IN AUTOMATIC CIRCUIT BOARD ASSEMBLY MACHINES

[75] Inventor: Hans Hein, Munich, Fed. Rep. of Germany

[73] Assignee: Siemens Aktiengesellschaft, Berlin and Munich, Fed. Rep. of Germany

[21] Appl. No.: 74,936

[22] Filed: Jul. 17, 1987

[30] Foreign Application Priority Data

Jul. 17, 1986 [DE] Fed. Rep. of Germany ....... 3624185

[51] Int. Cl.$^4$ .................... B65D 85/38; B65D 85/42
[52] U.S. Cl. .................... 206/332; 206/328; 206/820
[58] Field of Search .............. 206/328-334, 206/820

[56] References Cited

U.S. PATENT DOCUMENTS

| 1,572,125 | 2/1926 | Binder | 229/DIG. 4 |
|---|---|---|---|
| 1,821,668 | 9/1931 | Ross | 229/DIG. 4 |
| 3,222,437 | 12/1965 | Schilling | 229/DIG. 4 |
| 3,608,711 | 9/1971 | Wiesler et al. | 206/329 |
| 3,629,901 | 12/1971 | Wolf et al. | 229/DIG. 4 |
| 4,007,835 | 2/1977 | Kothe | 229/DIG. 4 |
| 4,298,120 | 11/1981 | Kaneko et al. | |
| 4,306,343 | 12/1981 | Rochat et al. | 206/332 |
| 4,657,137 | 4/1987 | Johnson | 206/329 |

FOREIGN PATENT DOCUMENTS

| 0161590 | 11/1985 | European Pat. Off. | 206/328 |
|---|---|---|---|
| 0050865 | 5/1982 | Fed. Rep. of Germany . | |
| 784958 | 7/1935 | France . | |
| 2149868 | 3/1973 | France . | |
| 2445273 | 7/1980 | France . | |
| 1401991 | 8/1975 | United Kingdom . | |
| 2151578 | 7/1985 | United Kingdom | 206/328 |
| 2163401 | 2/1986 | United Kingdom | 206/328 |
| 84/03194 | 8/1984 | World Int. Prop. O. | 206/328 |

OTHER PUBLICATIONS

Journal "Elektronik Nr. 21" (Electronics No. 21), pp. 104–121 of Oct. 23, 1981 (no translation).
International Electrotechnical Commission (IEC Standard Publication 286-3, first edition, 1986).

Primary Examiner—Jimmy G. Foster
Attorney, Agent, or Firm—Herbert L. Lerner; Laurence A. Greenberg

[57] ABSTRACT

A belt assembly for machine delivery of piece goods, includes a carrier belt having feed holes formed therein and having troughs formed therein at regular intervals for receiving piece goods. The carrier belt has folding zones free of the troughs disposed at fixed intervals. The folding zones including provisions for permitting the carrier belt to fold through 180° without strain, so that a multiplicity of the carrier belts can be stacked to form an ammo pack.

12 Claims, 2 Drawing Sheets

BELT FOR MACHINE DELIVERY OF PIECE GOODS, ESPECIALLY ELECTRICAL COMPONENTS AND MODULES IN AUTOMATIC CIRCUIT BOARD ASSEMBLY MACHINES

The invention relates to a belt or conveyor for the machine delivery of piece goods, especially electrical components and modules in automatic circuit board assembly machines, having a carrier belt that is provided with feed holes and troughs or stamped recesses disposed at regular intervals, which are covered with a detachable cover foil when packed.

Pages 104–121 of the Oct. 23, 1981 issue of The journal "Elektronik Nr. 21" (Electronics No. 21), provides a survey of present conventional systems in the field of assembly of electronic components and compares belt delivery with individual assembly or magazine delivery. In terms of handling, space requirements and cost for the necessary packing, the belt systems have notable advantages as compared with magazine and individual delivery, according to the article.

All over the world, attempts are being made to standardize the great number of present conventional belt systems. For example, in the standardization proposed by the International Electrotechnical Commission (IEC Standard Publication 286-3, first edition, 1986), the interval between and the size of the feed holes are defined, as are the thickness and width of the belt. Belt systems for delivering electronic components in automatic assembly machines are already widely used, especially in electronics processing plants. In such devices, hard-wired components are fixed to belts at the ends of the wires thereof by means of an adhesive tape and are packed for shipping by various methods.

Three kinds of packing for belts have proved themselves in practical use and have found acceptance. In so-called drum packs, the assembled belt is wound onto the shaft of a drum together with an accompanying belt, which serves as an intermediate layer to prevent the components from becoming tangled. As the belt unwinds, the drum itself turns on a shaft in a magazine chute.

So-called cassette packs are similar to drum packs, in that the belt is wound on a casing centered in a closed carton.

These two packaging methods, in which the contents are rolled, are contrasted with the method of layered packing, also known as ammo packing. In ammo packing, the belt is not rolled up but instead is folded in zig-zag fashion and accommodated in several layers in a carton, in a space-saving manner.

Only ammo packs also offer the option of delivering the components to the assembly machine rotated by 180° as needed. In that case, the opposite side of the carton is merely opened and the belt is unfolded from the end of the belt onward.

Lately, the automatic assembly of components without wire connections, in the so-called SMD technique (surface mounted devices), is preferred. Since these non-hard-wired components cannot be fixed in place with connecting wires, the belts themselves must be provided with suitable stamped-out recesses or troughs. While smaller components can be readily accommodated in the recesses of thick belts, larger wireless components can be packed only in so-called blister belts.

A blister belt is a plastic sheet in which troughs adapted to the component have been formed, for example by a deep-drawing method. Both the troughs and the stamped-out recesses are closed with removable cover foils, after the components have been placed in them.

Only roll packs can be used for transporting these blister belts. Layer packs, which save space and are favorable in cost, cannot be used for such a purpose because a sharp fold such as the ammo pack requires cannot be used for both thick belts and blister belts.

However, in the case of piece goods having a large surface area, the two kinds of roll packs also lead to problems. That is because when belts equipped with such goods are rolled up, a relatively large minimal winding diameter must be adhered to, which requires a large, above-average amount of space. Furthermore, the belt necessarily crimps between the components when being wound up and this carries with it the danger of the troughs having the components being deformed or the cover foil being compressed at exposed places and becoming detached.

It is accordingly an object of the invention to provide a belt or conveyor for machine delivery of piece goods, especially electrical components and modules in automatic circuit board assembly machines, which overcomes the hereinafore-mentioned disadvantages of the heretofore-known devices of this general type and to do so in such a way that the assembled belt can be produced economically, shipped dependably, and stored in a space-saving manner.

With the foregoing and other objects in view there is provided, in accordance with the invention, a belt assembly for machine delivery of piece goods, comprising a carrier belt or conveyor having feed holes formed therein and having troughs or stamped-out recesses formed therein at regular intervals for receiving piece goods, the carrier belt having folding zones free of the troughs disposed at fixed intervals which remain constant, and the folding zones including means for permitting the carrier belt to fold through 180° without strain, whereby a multiplicity of the carrier belts can be stacked to form an ammo pack.

Through the use of this embodiment of the belt assembly according to the invention, the method of space-saving layered packing, which has proved itself for hard-wired components, can also be applied to arbitrary forms of piece goods, in particular those intended for use with the SMD technique.

No strains at all are exerted upon the troughs or on the piece goods located therein. Compression or expansion of the cover foil takes place solely within the folding zone that is free of piece goods. This assures the maximum possible security against damage to piece goods. The layered pack, as compared with the roll pack, in principle results in better utilization of space and reduced cost, especially since the winding core or cone can be dispensed with.

The absence of the piece goods in the folding zones at regular intervals is recorded by the recognition devices of the automatic processing machines and is compensated for by simply feeding the belt onward by one trough or recess length.

In accordance with another feature of the invention, the folding zone has a length equal to the length of one of the troughs or stamped-out recesses.

In accordance with a further feature of the invention, the means for permitting the carrier belt to fold are in the form of perforations.

In accordance with an added feature of the invention, the perforations extend in the transverse and/or longitudinal direction of the carrier belt.

In accordance with an additional feature of the invention, the means for permitting the carrier belt to fold are in the form of depressions and/or corrugations extending transverse to the longitudinal direction of the the carrier belt.

In accordance with yet another feature of the invention, the carrier belt has a reduced thickness in the folding zone.

During the production of thick belts, for instance, both the recesses for the piece goods and the corresponding holes in the folding zone can be produced in a single operation. Blister belts can be equipped with beads or corrugations in the folding zones at the same time as the troughs are deep drawn.

In accordance with yet a further feature of the invention, the folding zone is in the form of a flexible intermediate piece.

In accordance with a concomitant feature of the invention, there is provided a cover foil at least partly forming the flexible intermediate piece and being glued over the troughs. The folding zone can be made particularly flexibly if the carrier belt in this zone is partly removed and replaced, for example by the cover foil itself or by a flexible intermediate piece.

Other features which are considered as characteristic for the invention are set forth in the appended claims.

Although the invention is illustrated and described herein as embodied in a belt or conveyor for machine delivery of piece goods, especially electrical components and modules in automatic circuit board assembly machines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
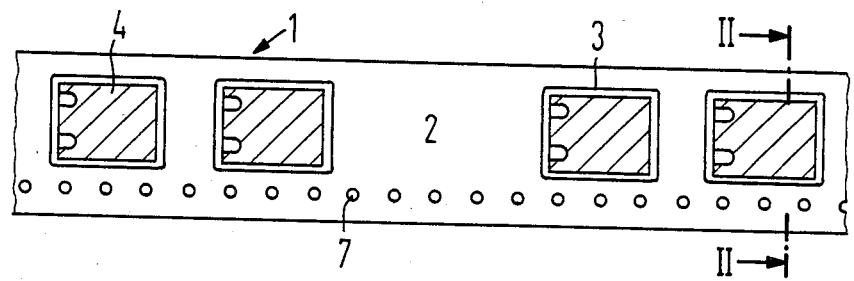
FIGS. 1 is a fragmentary, diagrammatic, top-plan view of a segment of an unfolded, loaded belt or conveyor according to the invention.

Referring now to the figures of the drawings in which identical elements are identified by the same reference numerals and first, particularly, to FIG. 1 thereof, there is seen a configuration of a carrier belt or conveyor segment 1 with a folding zone 2 in a sequence of deep-drawn or cup-shaped troughs or tubs 3 according to the invention. The length of the folding zone 2 is exactly equal to the length of one trough 3 together with the distances from the adjacent trough on either side. SMD components 4 are located in the troughs 3. In the illustration of FIG. 1, a cover foil that is glued over the troughs in order to prevent the components 4 from falling out, has not yet been welded on. Feed holes 7 for driving the belt or conveyor by machine have been stamped out of the lower edge of the belt.

Figure 2:
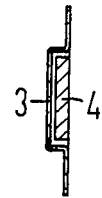
FIG. 2 is a cross-sectional view taken along the line II—II of FIG. 1, in the direction of the arrows.

FIG. 2, which is a section taken along the line II—II of FIG. 1, shows a deep-drawn trough 3 with a component 4 located therein.

Figure 3:
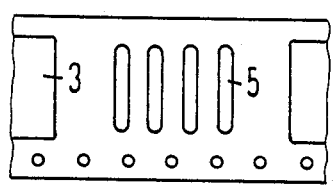
FIGS. 3-8 are views similar to FIG. 1 showing alternative embodiments of folding zones.
Figure 6:
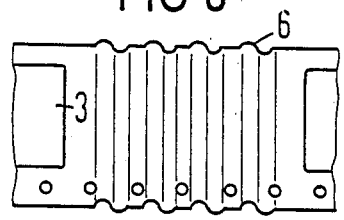
Figure 4:
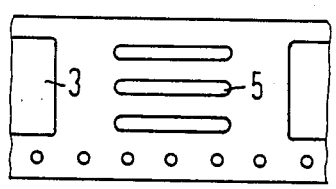
Figure 7:
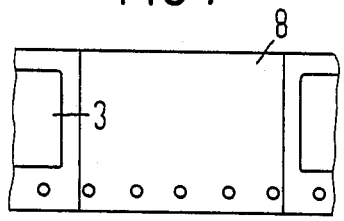
Figure 5:
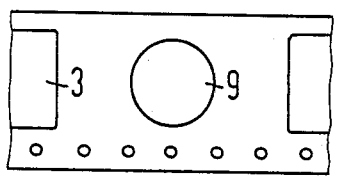
Figure 8:
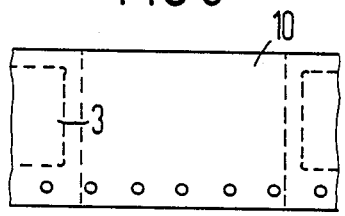

FIGS. 3-8 show special embodiments of the folding zone 2. In FIG. 3, a plurality of parallel holes 5 have been made in the carrier belt or conveyor, transverse to the direction of conveyance. In FIG. 4, the holes 5 extend in the direction of conveyance, while in FIG. 5 a single round hole 9 is provided for this purpose. FIG. 6 shows an embodiment with transverse corrugations 6 between the feed holes 7, while in FIG. 7 a portion of the carrier belt has been removed inside the folding zone 2 and replaced with a flexible intermediate piece 8. In FIG. 8, a portion of the carrier has been removed as in FIG. 7. In this case, the function of the flexible intermediate piece 8 is performed by a cover foil 10, which extends over the entire width of the belt and is provided with the feed holes 7.

Figure 9:
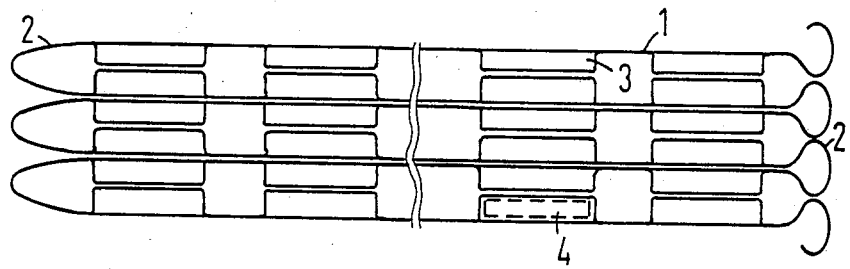
FIG. 9 is a side-elevational view of a folded belt equipped with piece goods, in a space-saving ammo pack.

Finally, FIG. 9 shows a portion of a multi-layer ammo pack. In each folding zone 2, the belt or conveyor segment 1 has been folded over through 180°. In this manner, straight belt segments are produced, in which there are no folding strains on the troughs 3 or on the components 4 contained therein. The belt segment folded in this manner can be space-savingly packed in a carton and can be unfolded by an automatic processing machine without additional feeding aids such as winding cones or shafts.

The foregoing is a description corresponding in substance to German Application P 36 24 185.7, dated July 17, 1986, the International priority of which is being claimed for the instant application, and which is hereby made part of this application. Any material discrepancies between the foregoing specification and the aforementioned corresponding German application are to be resolved in favor of the latter.

I claim:

1. Belt assembly for machine delivery of piece goods, comprising a carrier belt having feed holes formed therein, said carrier belt having relatively stiff zones with throughs formed therein at regular intervals for receiving piece goods, said carrier belt having relatively flexible folding zones free of said throughs disposed at fixed intervals, and said folding zones including means for permitting said carrier belt to fold through 180° without strain, whereby a multiplicity of said carrier belts can be stacked to form an ammo pack.

2. Belt according to claim 1, wherein said troughs are stamped-out recesses.

3. Belt according to claim 1, wherein said folding zone has a length equal to the length of one of said troughs.

4. Belt according to claim 2, wherein said folding zone has a length equal to the length of one of said stamped-out recesses.

5. Belt according to claim 1, wherein said means for permitting said carrier belt to fold are in the form of perforations.

6. Belt according to claim 5, wherein said perforations extend in the transverse direction of said carrier belt.

7. Belt according to claim 5, wherein said perforations extend in the longitudinal direction of said carrier belt.

8. Belt according to claim 1, wherein said means for permitting said carrier belt to fold are in the form of depressions extending transverse to the longitudinal direction of the said carrier belt.

9. Belt according to claim 1, wherein said means for permitting said carrier belt to fold are in the form of corrugations extending transverse to the longitudinal direction of the said carrier belt.

10. Belt according to claim 1, wherein said carrier belt has a reduced thickness in said folding zone.

11. Belt according to claim 1, wherein said folding zone is in the form of a flexible intermediate piece.

12. Belt according to claim 11, including a cover foil at least partly forming said flexible intermediate piece and being glued over said troughs.

* * * * *